United States Patent
Komaki et al.

(10) Patent No.: US 9,478,687 B2
(45) Date of Patent: Oct. 25, 2016

(54) SOLAR CELL AND PRODUCING METHOD THEREOF

(71) Applicant: TDK CORPORATION, Tokyo (JP)

(72) Inventors: Tsuyoshi Komaki, Tokyo (JP); Hirokazu Fujioka, Tokyo (JP); Hisao Morooka, Tokyo (JP); Hiroshi Yamada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 25 days.

(21) Appl. No.: 14/732,065

(22) Filed: Jun. 5, 2015

(65) Prior Publication Data

US 2015/0357493 A1 Dec. 10, 2015

(30) Foreign Application Priority Data

Jun. 5, 2014 (JP) .................. 2014-116990

(51) Int. Cl.
*H01L 31/0203* (2014.01)
*H01L 31/048* (2014.01)
*B32B 17/00* (2006.01)
*G04C 10/02* (2006.01)
*H01L 31/0392* (2006.01)
*H01L 31/075* (2012.01)
*H01L 31/046* (2014.01)

(52) U.S. Cl.
CPC ............ *H01L 31/048* (2013.01); *B32B 17/00* (2013.01); *G04C 10/02* (2013.01); *H01L 31/03921* (2013.01); *H01L 31/046* (2014.12); *H01L 31/0481* (2013.01); *H01L 31/075* (2013.01); *Y02E 10/548* (2013.01)

(58) Field of Classification Search
CPC ............ H01L 31/048; H01L 31/0481; H01L 31/075; H01L 31/046
USPC ........................................... 136/251
See application file for complete search history.

(56) References Cited

U.S. PATENT DOCUMENTS

| 5,637,156 A | 6/1997 | Kubota et al. |
| 6,525,261 B1 | 2/2003 | Kubota et al. |

FOREIGN PATENT DOCUMENTS

| JP | H11-140147 A | 5/1999 |
| JP | 2001-127327 A | 5/2001 |
| JP | 3594711 B2 | 12/2004 |
| JP | WO 2010/021197 | * 2/2010 |

* cited by examiner

*Primary Examiner* — Jayne Mershon
(74) *Attorney, Agent, or Firm* — Oliff PLC

(57) ABSTRACT

In a solar cell in a sheet form, a first cured resin layer, a substrate containing a resin, a photoelectric conversion layer, and a second cured resin layer are stacked in this order. The linear expansion coefficient of the first cured resin layer is not less than that of the second cured resin layer, and the linear expansion coefficient of the second cured resin layer is larger than that of the substrate. When the cure degree of a first surface of the first cured resin layer facing the substrate is $C_1$ % and the cure degree of a second surface of the first cured resin layer is $C_2$ %, $C_2$ is larger than $C_1$ and $(C_2-C_1)$ is 2 to 15%. A surface on the first cured resin layer of the solar cell is warped convexly and a surface on the second cured resin layer is warped concavely.

6 Claims, 5 Drawing Sheets

SOLAR CELL AND PRODUCING METHOD THEREOF

TECHNICAL FIELD

The present invention relates to a solar cell and a producing method thereof.

BACKGROUND

Solar cells in a sheet form like those described in Japanese Patent Application Laid-Open No. 2001-127327 are installed in, for example, electronic devices such as wristwatches or portable calculators as power sources (electricity generating devices).

SUMMARY

Problem to be Solved by the Invention

Figure 5A:
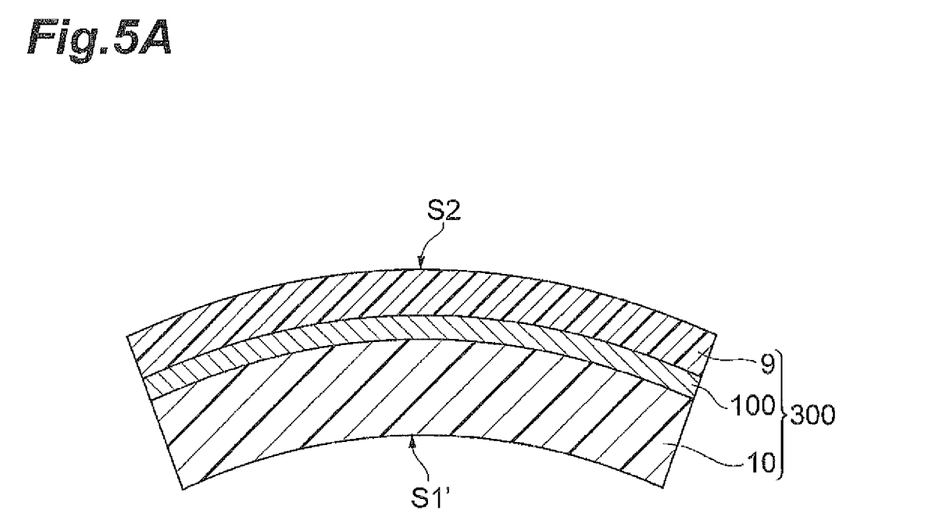
FIG. 5A is a schematic view of a conventional solar cell, and shows a cross section of the solar cell in the direction in which a substrate, a photoelectric conversion layer, and a second cured resin layer are stacked.

As shown in FIG. 5A, a conventional solar cell 300 in a sheet form includes, for example, a substrate 10 containing a resin, a photoelectric conversion layer 100 stacked on the substrate 10, and a protective layer (a second cured resin layer 9) stacked on the photoelectric conversion layer 100. The second cured resin layer 9 seals the photoelectric conversion layer 100. The surface of the second cured resin layer 9 is a light receiving surface. The substrate 10 is formed of a resin with a relatively small linear expansion coefficient (thermal expansion coefficient) in order to suppress changes in the dimensions and shape of the solar cell 300 with temperature changes. However, the present inventors have found that when the solar cell 300 is heated, the light receiving surface of the solar cell 300 (a surface S2 on the second cured resin layer 9 side) is warped convexly and a surface S1' of the solar cell 300 on the opposite side to the surface S2 is warped concavely, due to the fact that the linear expansion coefficient of the resin contained in the second cured resin layer 9 is larger than the linear expansion coefficient of the resin contained in the substrate 10 (see FIG. 5A). Such a shape of the solar cell is hereinafter referred to as a "convex shape,"

Figure 5B:
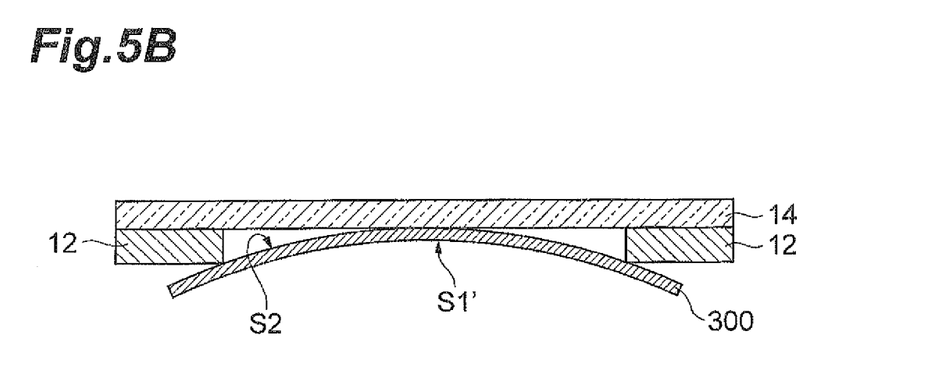
FIG. 5B is a schematic view showing a state where a conventional solar cell is installed in a wristwatch.

If the solar cell 300 is deformed to a convex shape with a temperature increase, in the electronic device, the light receiving surface of the solar cell 300 (the surface S2 on the second cured resin layer 9 side) will be in contact with a portion that should normally not be contacted. For example, in the case where the solar cell is installed in a wristwatch, as shown in FIG. 5B, the solar cell 300 is installed under a dial plate 14 via a spacer 12 in a state where the light receiving surface (the surface S2 on the second cured resin layer 9 side) faces the dial plate 14. If the solar cell 300 is deformed to a convex shape with a temperature increase, the light receiving surface of the solar cell 300 will be in contact with the dial plate as shown in FIG. 5B. Consequently, the performance of the solar cell or the wristwatch, or the external appearance of the wristwatch will be impaired. With the recent downsizing and thinning of wristwatches, the spacing between the solar cell 300 and the dial plate 14 is becoming narrower, and it is becoming more likely that the surface S2 of the solar cell 300 will be in contact with the dial plate 14.

In a wide range of electronic devices, as in the case of wristwatches, it is problematic that the solar cell is deformed to a convex shape with a temperature increase. That is, since the space allowed for the installation of the solar cell in an electronic device is becoming smaller with the recent downsizing and thinning of electronic devices, it is an important issue to suppress the deformation of the solar cell with a temperature increase.

The present inventors attempted to suppress the solar cell 300 being deformed to a convex shape, by covering the surface S1' of the substrate 10 located on the opposite side to the protective layer (the second cured resin layer 9) with a cured resin layer having a composition and a thickness identical or similar to those of the second cured resin layer 9 and thus making the structure of the solar cell symmetric. However, when these two cured resin layers were sequentially formed, one of the cured resin layers was deformed earlier due to the curing and shrinkage of the resin and the solar cell 300 became a convex shape even at room temperature.

When the photoelectric conversion layer 100 is sandwiched by a pair of substrates 10 in order to make the structure of the solar cell symmetric, the production costs of the solar cell will be increased or the producing method will be complicated.

The present invention is made in view of the circumstances mentioned above, and an object of the present invention is to provide a solar cell that is less likely to have a convex shape and can suppress the solar cell being deformed to a convex shape with a temperature increase, and a producing method thereof.

Means for Solving the Problem

A solar cell according to an aspect of the present invention is a solar cell in a sheet form comprising: a first cured resin layer; a substrate stacked on the first cured resin layer and containing a resin; a photoelectric conversion layer stacked on the substrate; and a second cured resin layer stacked on the photoelectric conversion layer, wherein the linear expansion coefficient of the cured resin contained in the first cured resin layer is not less than the linear expansion coefficient of the cured resin contained in the second cured resin layer, the linear expansion coefficient of the cured resin contained in the second cured resin layer is larger than the linear expansion coefficient of the resin contained in the substrate, $C_2$ is larger than $C_1$ and $(C_2-C_1)$ is 2 to 15% when the cure degree of a first surface side of the first cured resin layer facing the substrate is denoted by $C_1$ % and the cure degree of a second surface side of the first cured resin layer on the opposite side to the first surface is denoted by $C_2$ %, the surface on the first cured resin layer side of the solar cell is warped convexly, and the surface on the second cured resin layer side of the solar cell is warped concavely.

In an aspect of the present invention, the thickness of the first cured resin layer may be 5 to 50 μm and the thickness of the second cured resin layer may be 3 to 30 μm.

In an aspect of the present invention, the first cured resin layer may be formed of an ultraviolet curable epoxy resin.

In an aspect of the present invention, the internal stress of the first cured resin layer may be larger than the internal stress of the second cured resin layer.

In an aspect of the present invention, the first cured resin layer may be thicker than the second cured resin layer.

A method for producing a solar cell according to an aspect of the present invention is a method for producing the solar cell mentioned above, and comprises: a step of forming a photoelectric conversion layer on a substrate; a step of forming a second cured resin layer on the photoelectric conversion layer; and a step of forming a first cured resin layer by attaching an ultraviolet curable resin to a surface of the substrate located on the opposite side to the photoelectric conversion layer and irradiating the ultraviolet curable resin with ultraviolet light in a state where a heat sink (a heat radiator) is kept in contact with the second cured resin layer.

Effects of the Invention

The present invention provides a solar cell that is less likely to have a convex shape and can suppress the solar cell being deformed to a convex shape with a temperature increase, and a producing method thereof.

DETAILED DESCRIPTION

Hereinbelow, a preferred embodiment of the present invention is described, occasionally with reference to the drawings. However, the present invention is not limited to the embodiment described below. In the drawings, identical or equivalent components are marked with the same reference characters.

(Solar Cell)

Figure 1A:
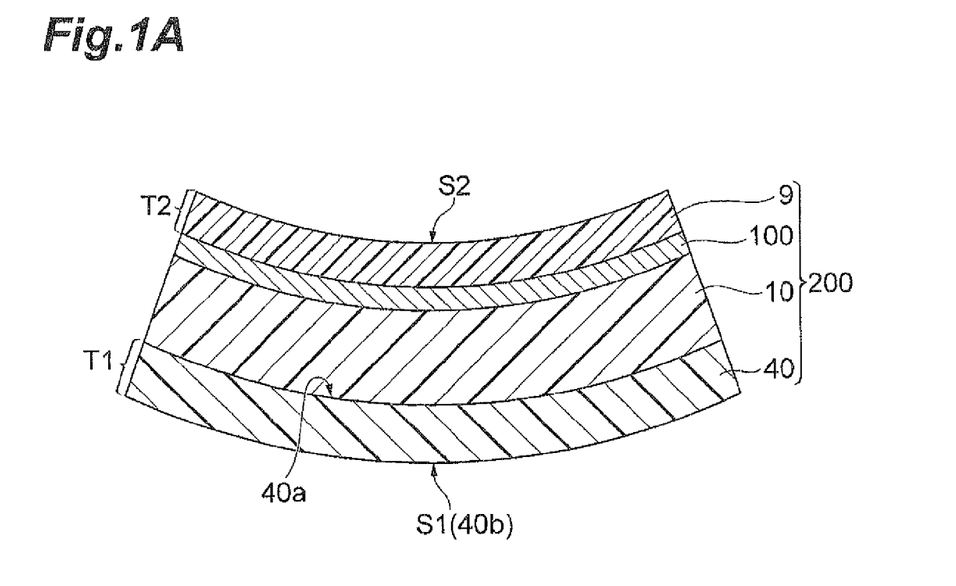
FIG. 1A is a schematic view of a solar cell according to an embodiment of the present invention, and shows a cross section of the solar cell in the direction in which a first cured resin layer, a substrate, a photoelectric conversion layer, and a second cured resin layer are stacked.
Figure 2:
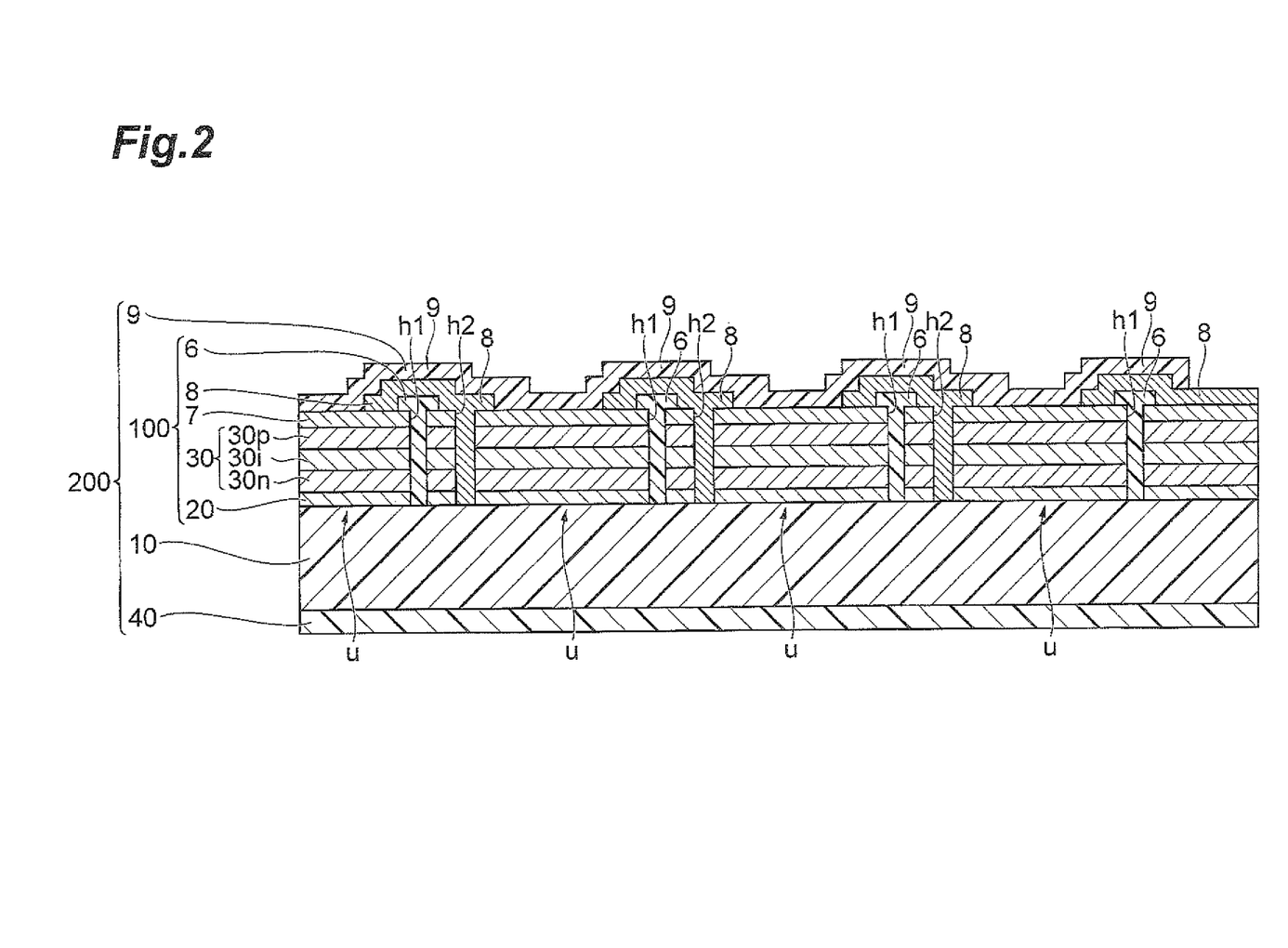
FIG. 2 is a schematic view of a solar cell according to an embodiment of the present invention, and shows a cross section of the solar cell in the direction in which the first cured resin layer, the substrate, the photoelectric conversion layer, and the second cured resin layer are stacked.

As shown in FIG. 1A and FIG. 2, a solar cell 200 according to the embodiment is in a sheet form. The solar cell 200 comprises a first cured resin layer 40, a substrate 10 stacked on a part or the whole of the first cured resin layer 40, a photoelectric conversion layer 100 stacked on a part or the whole of the substrate 10, and a second cured resin layer 9 (a protective layer) stacked on a part or the whole of the photoelectric conversion layer 100. The substrate 10 is in a film form, and contains a resin.

The linear expansion coefficient of the cured resin contained in the first cured resin layer 40 is not less than the linear expansion coefficient of the cured resin contained in the second cured resin layer 9. The linear expansion coefficient of the cured resin contained in the second cured resin layer 9 is larger than the linear expansion coefficient of the resin contained in the substrate 10.

When the cure degree of a first surface 40a side of the first cured resin layer 40 facing the substrate 10 is denoted by $C_1$ % and the cure degree of a second surface 40b side of the first cured resin layer 40 on the opposite side to the first surface 40a is denoted by $C_2$ %, $C_2$ is larger than $C_1$ and $(C_2-C_1)$ is 2 to 15%. $(C_2-C_1)$ may be 2.6 to 13.5%, or 3 to 10%. The cure degree of the surface side of a cured resin layer may refer to, for example, the cure degree of the cured resin layer in a region at a distance (depth) of 5 μm or less from the surface.

The cure degree C (%) of a resin is expressed by, for example, Equation 1.

$$C = \{1 - (i \times i_S/i_{S0})/i_0\} \times 100 \quad (1)$$

In Equation 1, the symbol $i_0$ denotes the intensity at the wave number w in the infrared spectroscopy spectrum of an unreacted monomer (a resin that is not cured at all) that is a precursor of a cured resin. The symbol $i_{S0}$ denotes the intensity at the wave number $w_S$ in the infrared spectroscopy spectrum of the unreacted monomer, and is an intensity substantially constant before and after the curing of the resin (curing reaction). That is, the wave number $w_S$ is derived from a portion of the molecular structure of the monomer which is not changed by the curing reaction. The symbol i denotes the intensity at the wave number w in the infrared spectroscopy spectrum of a resin of which the cure degree is unknown (a sample of which the cure degree should be specified). The symbol $i_S$ denotes the intensity at the wave number $w_S$ in the infrared spectroscopy spectrum of the resin of which the cure degree is unknown. Since the wave number $w_S$ is derived from a portion of the molecular structure of the monomer which is not changed by the curing reaction, theoretically the $i_S$ of the cured resin is substantially equal to the $i_{S0}$ of the monomer. However, in the actual measurement, since not only the cure degree but also other various factors influence the infrared spectroscopy spectrum, the intensity of the infrared spectroscopy spectrum varies between measurements. Therefore, the measured value of $i_S$ does not necessarily coincide with the measured value of $i_{S0}$, and the ratio between the measured values i and $i_0$ (i/$i_0$) may be influenced by not only the cure degree but also other factors. Thus, in order to calculate the correct cure degree C on the basis of the measured values i and $i_0$, it is necessary to standardize i and correct the errors of the cure degree resulting from factors other than the cure degree. For such a reason, i is multiplied by $i_S/i_{S0}$ as a correction factor to standardize the intensity i, and the standardized i (i.e., $i \times i_S/i_{S0}$) and $i_0$ are compared; thus, the cure degree C is obtained. The symbol $i_0$ may be a corrected value obtained by subtracting the intensity of the base line of the entire spectrum from the intensity at the wave number w in the infrared spectroscopy spectrum of the unreacted monomer. The symbol $i_{S0}$ may be a corrected value obtained by subtracting the intensity of the base line of the entire spectrum from the intensity at the wave number $w_S$ in the infrared spectroscopy spectrum of the unreacted monomer. The symbol i may be a corrected value obtained by subtracting the intensity of the base line of the entire spectrum from the intensity at the wave number w in the infrared spectroscopy spectrum of the resin of which the cure degree is unknown. The symbol $i_S$ may be a corrected value obtained by subtracting the intensity of the base line of the entire spectrum from the intensity at the wave number $w_S$ in the infrared spectroscopy spectrum of the resin of which the cure degree is unknown.

The wave number w is the wave number at which there is a significant difference in intensity between the infrared spectroscopy spectrum of the unreacted monomer and the infrared spectroscopy spectrum of the cured resin that is completely cured. The wave number w depends on the type (molecular structure) of the cured resin or the monomer. For example, the wave number w may be one derived from a portion of the molecular structure of the monomer which is changed by the curing reaction (a structure that is not present in the cured resin that is completely cured). That is, the wave number w may be one derived from a portion of the molecular structure of the monomer which is directly involved in the bond between monomers. In this case, in the infrared spectroscopy spectrum of the cured resin that is completely cured, a peak at the wave number w is less likely to appear. In this case, $i_0$ is larger than i, and the inequalities of $i_0 \geq i \geq 0$ hold. Each infrared spectroscopy spectrum mentioned above is measured by, for example, Fourier transform infrared spectroscopy (FT-IR).

As above, Equation 1 means that the cure degree of a resin is calculated on the basis of the infrared spectroscopy spectrum of the resin of which the cure degree is unknown. As is clear from Equation 1, the cure degree C corresponds to the reaction rate of the curing reaction.

In obtaining the cure degree $C_1$ of the first surface 40$a$ side of the first cured resin layer 40, for example, the infrared spectroscopy spectrum of a resin, that is formed of the same source material (including monomers) as the first cured resin layer 40 and is completely cured, is measured. Further, the infrared spectroscopy spectrum of the source material (uncured source material) of the first cured resin layer 40 is measured. Based on these infrared spectroscopy spectra, w and $w_S$ may be selected, and $i_0$ at the wave number w and $i_{S0}$ at the wave number $w_S$ may be obtained. Alternatively, it is possible to select w and $w_S$ and obtain $i_0$ at the wave number w and $i_{S0}$ at the wave number $w_S$ on the basis of only the infrared spectroscopy spectrum of the source material (uncured source material) of the first cured resin layer 40. Then, Equation 1 is derived from these values. Next, the first cured resin layer 40 is peeled off from the solar cell 200, and the infrared spectroscopy spectrum of the first surface 40$a$ of the first cured resin layer 40 is measured. From the measurement result, the i and $i_S$ of the first surface 40$a$ are obtained. Then, the cure degree $C_1$ of the first surface 40$a$ is calculated on the basis of Equation 1. Further, the infrared spectroscopy spectrum of the second surface 40$b$ of the first cured resin layer 40 on the opposite side to the first surface 40$a$ is measured. From the measurement result, the i and $i_S$ of the second surface 40$b$ are obtained. Then, the cure degree $C_2$ of the second surface 40$b$ is calculated on the basis of Equation 1.

A surface S1 on the first cured resin layer 40 side of the solar cell 200 is warped convexly, and a surface S2 on the second cured resin layer 9 side of the solar cell 200 is warped concavely. The surface S1 on the first cured resin layer 40 side of the solar cell 200 is the same as the second surface 40$b$ of the first cured resin layer 40. The surface S2 on the second cured resin layer 9 side of the solar cell 200 is the outer surface of the second cured resin layer 9, and is a light receiving surface.

Hereinafter, a structure, in which the surface S1 on the first cured resin layer 40 side of the solar cell 200 is warped convexly and the surface S2 on the second cured resin layer 9 side of the solar cell 200 (the light receiving surface) is warped concavely, is referred to as a "concave shape" of the solar cell. Although the solar cell 200 shown in FIG. 2 appears not to be warped for convenience of illustration, the actual solar cell 200 has a concave shape as shown in FIG. 1A.

In an environment where the temperature is 25° C. and the relative humidity (RH) is 50%, the solar cell 200 has a concave shape. The linear expansion coefficient of the cured resin contained in the first cured resin layer 40 is not less than the linear expansion coefficient of the cured resin contained in the second cured resin layer 9, $C_2$ is larger than $C_1$, and ($C_2-C_1$) is 2 to 15%; therefore, even if the solar cell 200 is heated to, for example, 80° C., the solar cell 200 being deformed to a convex shape is suppressed. That is, even if the temperature of the solar cell 200 is increased, the concave shape of the solar cell 200 is maintained. If the linear expansion coefficient of the cured resin contained in the first cured resin layer 40 is not larger than the linear expansion coefficient of the cured resin contained in the second cured resin layer 9, or if the first cured resin layer 40 is not present, the solar cell 200 will have a convex shape at room temperature or the solar cell 200 that is in a concave shape at room temperature will be deformed to a convex shape due to heating, because the linear expansion coefficient of the cured resin contained in the second cured resin layer 9 is larger than the linear expansion coefficient of the resin contained in the substrate 10. If ($C_2-C_1$) is less than 2%, the solar cell 200 will have a convex shape at room temperature. If ($C_2-C_1$) is larger than 15%, the solar cell 200 can have a concave shape at room temperature, but will be deformed to a convex shape when heated.

Figure 1B:
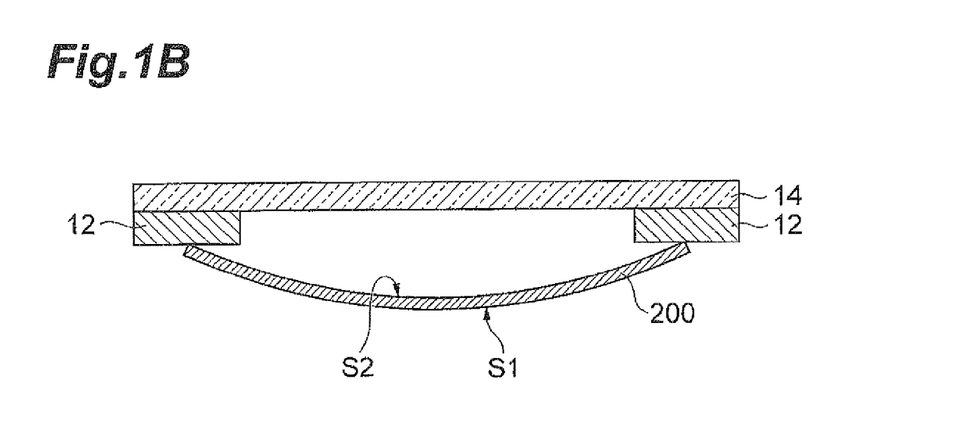
FIG. 1B is a schematic view showing a state where a solar cell according to an embodiment of the present invention is installed in a wristwatch.

Thus, the solar cell 200 according to the embodiment has a concave shape, and the concave shape is maintained even when heated. Therefore, when, as shown in FIG. 1B, the solar cell 200 is installed under the dial plate 14 via the spacer 12 in a state where the light receiving surface (the surface S2 on the second cured resin layer 9 side) faces the dial plate 14, the light receiving surface of the solar cell 200 is less likely to be in contact with the dial plate 14. Also when the solar cell 200 is installed in a limited small space in an electronic device other than wristwatches, the light receiving surface of the solar cell 200 is less likely to be in contact with a portion that should normally not be contacted.

The function and effect according to the embodiment will now be described on the basis of a specific example. For example, in the case where the substrate 10 is made of a resin with a linear expansion coefficient of 20 ppm/° C. (e.g. polyethylene naphthalate), the second cured resin layer 9 is made of a cured resin with a linear expansion coefficient of 55 ppm/° C., and the first cured resin layer 40 is not present, when the temperature of the environment in which the solar cell is placed is increased, the solar cell will become a convex shape easily due to the difference in linear expansion coefficient. For example, when the temperature of the environment has changed from 25° C. to 80° C., the second cured resin layer 9 expands more than the substrate 10 and the solar cell becomes a convex shape easily because the product of the difference in linear expansion coefficient (35 ppm/° C.) and the amount of temperature change (55° C.) is 1925 ppm. However, in the embodiment, the first cured resin layer 40 and the second cured resin layer 9 are disposed symmetrically with respect to the substrate 10, and the linear expansion coefficient of the cured resin contained in the first cured resin layer 40 is not less than the linear expansion coefficient of the cured resin contained in the second cured resin layer 9; therefore, the solar cell 200 being deformed to a convex shape with a temperature change is suppressed. However, the function and effect according to the embodiment is not limited to the specific example described above.

The linear expansion coefficient (the average value of the linear expansion coefficient) of the cured resin contained in the first cured resin layer 40 may be, for example, 60 to 120 ppm/° C. or 80 to 120 ppm/° C. The cured resin contained in the first cured resin layer 40 may be a photocured resin or a thermoset resin. The cured resin contained in the first cured resin layer 40 may be, for example, one or both of an epoxy resin and an oxetane resin. The epoxy resin and the oxetane resin may be cured by light (e.g. ultraviolet light) or heat. The epoxy resin may be, for example, at least one selected from the group consisting of bisphenol A type epoxy resins, bisphenol F type epoxy resins, novolak type epoxy resins, dicyclopentadiene type epoxy resins, alicyclic epoxy resins, naphthalene type epoxy resins, diphenyl type epoxy resins, and polyfunctional epoxy resins. The linear expansion coefficient of the cured resins mentioned above is in the range mentioned above. The linear expansion coefficient of the entire cured resin may be adjusted to a desired value by mixing a plurality of the cured resins mentioned above. For example, a cured resin having a relatively large linear expansion coefficient is prepared by blending a bifunctional bisphenol A type epoxy resin or a bifunctional alicyclic epoxy resin with an oxetane resin that is the main component. For example, one or a mixture of polyfunctional epoxy resins, naphthalene type epoxy resins, and dicyclopentadiene type epoxy resins has a relatively small linear expansion coefficient. Alicyclic epoxy resins or oxetane resins are easily used for the first cured resin layer 40 from the viewpoints of the reaction rates (curing rates) of resins, low shrinkage coefficients, and large linear expansion coefficients.

Photocured resins are easier in the control of the cure degree than thermoset resins. Therefore, the first cured resin layer 40 may be formed of, for example, an ultraviolet curable epoxy resin. In this case, it is easy to control the cure degrees $C_1$, $C_2$, and $(C_2-C_1)$ mentioned above to desired values in the process of forming the first cured resin layer 40.

The first cured resin layer 40 may be made of only the curable resins mentioned above. The first cured resin layer 40 may contain a plurality of fillers described later as an accessory component, in addition to a cured resin that is the main component.

The linear expansion coefficient (the average value of the linear expansion coefficient) of the cured resin contained in the second cured resin layer 9 may be, for example, 50 to 70 ppm/° C. The cured resin contained in the second cured resin layer 9 may be, for example, a thermosetting resin. The thermosetting resin contained in the second cured resin layer 9 may be, for example, at least one selected from the group consisting of phenol resins (PF), epoxy resins (EP), melamine resins (MF), urea resins (UF), unsaturated polyester resins (UP), polyimide resins (PT), polyurethane resins (PUR), phenoxy resins, and alkyd resins. The second cured resin layer 9 may be made of only the curable resins mentioned above. The cured resin contained in the second cured resin layer 9 may be a photocurable resin. The second cured resin layer 9 may contain a plurality of fillers that are an accessory component, in addition to a cured resin that is the main component. By fillers being contained, it becomes easier to mold the second cured resin layer 9 by printing, the aesthetic appearance of the solar cell is improved, the conversion efficiency of the solar cell is improved, and the mechanical strength of the resin layer is improved. The filler is not particularly limited. The filler may be an organic filler. The organic filler may be, for example, a cross-linked acrylic resin, a cross-linked styrene resin, a cross-linked urethane resin, or a silicone resin. The filler may be an inorganic filler. The inorganic filler may be, for example, an oxide such as silica; a hydroxide such as calcium hydroxide; a carbonate such as calcium carbonate; a sulfate such as barium sulfate; or a silicate such as talc, mica, or wollastonite. The particle size of the filler may be, for example, 5 nm to 10 μm, or 10 nm to 1 μm. The amount of filler added may be adjusted to a level such that an appropriate viscosity and thixotropy of the resin are obtained, in accordance with the viscosity of the resin before curing and the method for applying the resin.

The linear expansion coefficient (the average value of the linear expansion coefficient) of the resin contained in the substrate 10 may be, for example, 10 to 40 ppm/° C. The resin contained in the substrate 10 may be, for example, at least one selected from the group consisting of polyethylene naphthalates (PEN), polyethylene terephthalates (PET), polybutylene terephthalates (PBT), polyimides (PI), polyetherimide (PEI), polyphenyl sulfides (PPS), liquid crystal polymers (LCP), polyether ether ketones (PEEK), amorphous polyarylates (PAR), and aramid resins. The substrate 10 is formed by extending these resins good in heat resistance. The substrate 10 may be made of only the resins mentioned above. Of the substrates 10 formed of the resins mentioned above, the substrate 10 formed of PEN is relatively good in that its linear expansion coefficient is small and its dimensions are stable.

In the first cured resin layer 40, the curing and shrinkage of the resin proceed with an increase in the temperature thereof, and internal stress occurs with the curing and shrinkage of the resin. This applies also to the second cured resin layer 9. The internal stress of the first cured resin layer 40 may be larger than the internal stress of the second cured resin layer 9. In this case, the solar cell 200 is likely to have a concave shape, and the concave shape is likely to be maintained even when the temperature of the solar cell 200 is increased. That is, the concave shape of the solar cell 200 tends to be stable to the temperature change of the solar cell 200, The internal stress generated in each cured resin layer with the temperature change is simply calculated on the basis of Equation 2, for example.

$$\sigma = \Delta t \times CTE \times Y \times T \qquad (2)$$

In Equation 2, the symbol σ denotes the internal stress. The symbol Δt denotes the amount of temperature change (t2−t1) of the cured resin layer. The symbol CTE denotes the linear expansion coefficient of the resin contained in the cured resin layer. The symbol Y denotes the Young's modulus (elastic modulus) of the cured resin layer. The symbol T denotes the thickness of the cured resin layer.

For example, the internal stress of the second cured resin layer 9 is approximately 76 Pa when the temperature of the second cured resin layer 9 has changed from 25° C. to 80° C. (Δt is 55° C.), the linear expansion coefficient of the resin contained in the second cured resin layer 9 is 55 ppm/° C., the Young's modulus of the second cured resin layer 9 at 80° C. (t2) is 2.5 GPa, and the thickness of the second cured resin layer 9 is 10 μm. Thus, when the internal stress of the first cured resin layer 40 is larger than 76 Pa, the solar cell 200 is likely to have a concave shape, and the concave shape is likely to be maintained even when the temperature of the solar cell 200 is increased. That is, a cured resin of which the linear expansion coefficient is larger than that of the cured resin contained in the second cured resin layer 9 may be used for the first cured resin layer 40 so that the internal stress of the first cured resin layer 40 is larger than the internal stress of the second cured resin layer 9. The thickness of each cured resin may be adjusted in accordance with the Young's modulus of each cured resin to balance the Young's modulus and the thickness. However, the embodiment is not limited to the specific example described above.

The first cured resin layer 40 may be thicker than the second cured resin layer 9. In this case, as is clear from Equation 2, the internal stress of the first cured resin layer 40 is likely to be larger than the internal stress of the second cured resin layer 9.

The thickness T1 (for example, the average thickness) of the first cured resin layer 40 may be, for example, 5 to 50 μm, and the thickness T2 (for example, the average thickness) of the second cured resin layer 9 may be, for example, 3 to 30 μm. When T1 and T2 are in the ranges mentioned above, the internal stress of the first cured resin layer 40 is likely to be larger than the internal stress of the second cured resin layer 9. For a similar reason, the thickness (for example, the average thickness) of the substrate 10 may be, for example, 25 to 150 μm.

The photoelectric conversion layer 100 includes a lower electrode 20, a photoelectric conversion unit 30, an insulating resin layer 6, a transparent electrode layer 7, and an interconnection layer 8.

The lower electrode 20 is provided on the substrate 10. The lower electrode 20 is formed of an electrically conductive material. The lower electrode 20 may be made of a metal that reflects light. For example, the lower electrode 20 may contain at least one metal selected from the group consisting of aluminum, titanium, silver, and stainless steel. The lower electrode 20 may be a stacked body formed of a plurality of metal layers. The lower electrode 20 is formed by, for example, the sputtering method.

The photoelectric conversion unit 30 is provided on the lower electrode 20. In an amorphous silicon-based solar cell, for example, an n-type amorphous silicon thin film 30n, an i-type amorphous silicon thin film 30i, and a p-type amorphous silicon thin film 30p are stacked on the lower electrode 20 in this order. The thin films that constitute the photoelectric conversion unit 30 are formed by, for example, plasma CVD or sputtering. The photoelectric conversion unit 30 may be a photoelectric conversion unit of a type other than the above.

The transparent electrode layer 7 is formed on the photoelectric conversion unit 30. The transparent electrode layer 7 may be formed of, for example, ITO (an indium-tin oxide compound). The transparent electrode layer 7 is formed by, for example, sputtering.

In the lower electrode 20, the photoelectric conversion unit 30, and the transparent electrode layer 7, openings h1 and h2 penetrating through them are formed. The openings h1 and h2 are formed by, for example, laser processing. In order to form unit cells, the opening h1 separates the stacked structure of the lower electrode 20, the photoelectric conversion unit 30, and the transparent electrode layer 7 in the horizontal direction, and insulates them from each other.

The insulating resin layer 6 is buried in the opening h1. The insulating resin layer 6 is formed by, for example, the screen printing method using an insulating ink. An insulating ink is attached to a desired position by screen printing, and then the insulating ink is heated in an oven and dried; thus, the insulating resin layer 6 is formed. The insulating ink may be, for example, a mixture of a phenoxy resin or an epoxy resin, a polyfunctional isocyanate compound, and an organic solvent like one described in Japanese Patent No. 3594711. Alternatively, the insulating ink may be, for example, a mixture of at least one selected from the group consisting of saturated polyester resins, epoxy resins, acrylic resins and polyimide resins, a melamine resin, and an organic solvent like one described in Japanese Patent Application Laid-Open No. 11-140147. The organic solvent needs only to be capable of dissolving the resins mentioned above, and may be, for example, cyclohexanone, isophorone, γ-butyrolactone, N-methylpyrrolidone, butyl cellosolve acetate, or butyl carbitol acetate. The organic solvents mentioned above may be used singly or used mixedly.

The opening h2 is close to the opening h1. The interconnection layer 8 fills the opening h2, and extends over the top of the insulating resin layer 6 filling the opening h1 to a portion on the transparent electrode layer 7 of an adjacent unit cell u. Thereby, the unit cells u are electrically connected in series.

The interconnection layer 8 is formed of an electrically conductive material. For example, an electrically conductive ink made of a resin and electrically conductive particles dispersed in the resin is attached to a desired position by screen printing, and then the electrically conductive ink is heated in an oven and dried; thus, the interconnection layer 8 is formed. The electrically conductive particle may be formed of, for example, carbon black, graphite, or silver.

(Method for Producing a Solar Cell)

Figure 3A:
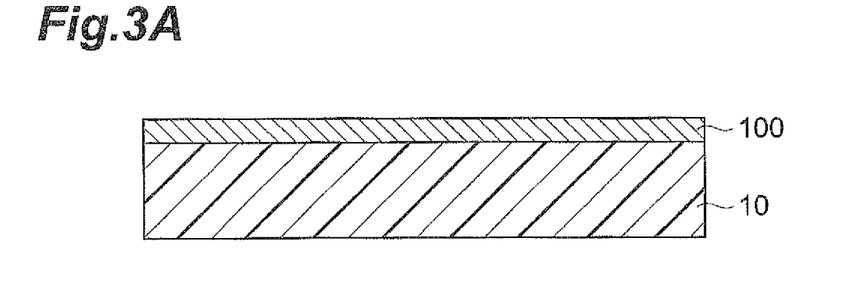
FIG. 3A, FIG. 3B, and FIG. 3C are schematic views showing a method for producing a solar cell according to an embodiment of the present invention.

As shown in FIG. 3A, in the method for producing the solar cell 200 according to the embodiment, first, the photoelectric conversion layer 100 is formed on the substrate 10. Plasma CVD or sputtering is used for the formation of the photoelectric conversion layer 100; therefore, a temperature difference occurs between the photoelectric conversion layer 100 and the substrate 10 and a stress that compresses the substrate 10 occurs. Consequently, in the stacked body formed of the photoelectric conversion layer 100 and the substrate 10 shown in FIG. 3A, the surface of the photoelectric conversion layer 100 may be warped convexly.

Figure 3B:
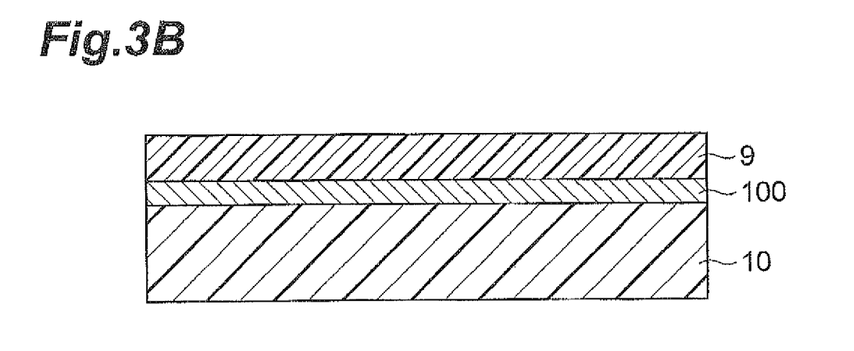

As shown in FIG. 3B, before forming the first cured resin layer 40, the second cured resin layer 9 is formed on the photoelectric conversion layer 100. For example, a coating material containing an uncured resin, a polymerization initiator and a solvent is prepared. The uncured resin may be a thermosetting resin or a photocurable resin. The polymerization initiator may be a thermal polymerization initiator or a photopolymerization initiator. The coating material is applied to the surface of the photoelectric conversion layer 100 by screen printing or the like to form a coated film. In the case where a thermosetting resin is used, by heating the coated film, a thermosetting reaction proceeds and the second cured resin layer 9 is formed. The surface of the second cured resin layer 9 may be warped convexly due to the curing and shrinkage of the coated film. However, the surface of the second cured resin layer 9 can be made flat or warped concavely by adjusting the thickness of the coated film. That is, the direction and degree of warpage of the surface of the second cured resin layer 9 can be adjusted by adjusting the thickness of the coated film. However, even when the surface of the second cured resin layer 9 has been warped concavely, if the first cured resin layer 40 is not present, the second cured resin layer 9 will expand and the surface of the second cured resin layer 9 will be warped convexly with an increase in temperature. If the first cured resin layer 40 is formed before the second cured resin layer 9 is formed, it is likely that warped products in progress will be formed and it will be difficult to transfer the products in progress.

Figure 3C:
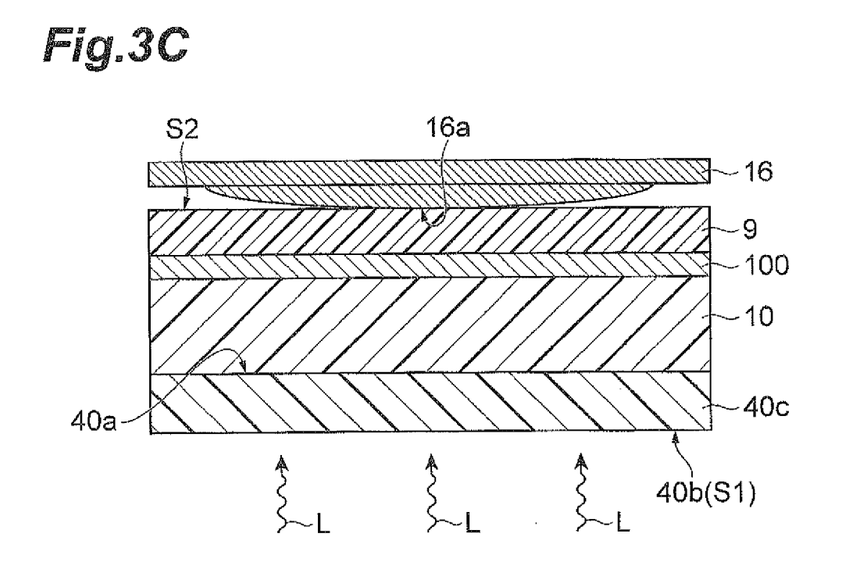

As shown in FIG. 3C, after the formation of the second cured resin layer 9, the first cured resin layer 40 is formed by the following sequence. First, a coating material containing an ultraviolet curable resin (uncured resin) of which the linear expansion coefficient is larger than that of the resin used for the formation of the second cured resin layer 9 is prepared. The coating material is applied to a surface of the substrate 10 located on the opposite side to the photoelectric conversion layer 100 to form a precursor layer 40c (a coated film). Ultraviolet light L is applied to the outer surface (40b)

of the precursor layer 40c in a state where a heat sink 16 is kept in contact with the surface of the second cured resin layer 9 (the surface S2). Consequently, the curing (photopolymerization reaction) of the ultraviolet curable resin in the precursor layer 40c proceeds and the first cured resin layer 40 is formed; thus, the solar cell 200 is completed.

If the ultraviolet curable resin in the precursor layer 40c is cured without keeping the heat sink 16 in contact with the surface of the second cured resin layer 9, the curing reaction of the ultraviolet curable resin proceeds rapidly in the entire precursor layer 40c due to the heat generated in the light source of ultraviolet light, and the reaction heat of the photopolymerization reaction. Consequently, it is difficult to make the cure degree $C_2$ mentioned above larger than the cure degree $C_1$, and it is also difficult to control $(C_2-C_1)$ to 2 to 15%. That is, when the heat sink 16 is not used, it is likely that the curing and shrinkage of the ultraviolet curable resin will proceed uniformly in the entire precursor layer 40c, and that the solar cell 200 will become a convex shape. On the other hand, in the embodiment, heat radiation is made by the heat sink 16 pressed against the surface of the second cured resin layer 9 (the surface S2). Due to the heat radiation, a temperature difference occurs between the outer surface (40b) of the precursor layer 40c to which ultraviolet light is applied and the deep portion of the precursor layer 40c (the inner surface (40a) of the precursor layer 40c which is in contact with the substrate 10). Due to the temperature difference, a difference in the reaction rate of the photopolymerization reaction occurs between the outer surface of the precursor layer 40c and the deep portion of the precursor layer 40c. That is, the curing of the ultraviolet curable resin in the deep portion of the precursor layer 40c lags behind. Due to the difference in the reaction rate (the control of the reaction rate), a difference in the cure degree (or a difference in stress) occurs between the first surface 40a of the first cured resin layer 40 facing the substrate 10 and the second surface 40b of the first cured resin layer 40 on the opposite side to the first surface 40a. That is, the cure degree $C_2$ is larger than the cure degree $C_1$. Consequently, the second surface 40b of the first cured resin layer 40 (the surface S1 of the solar cell 200) is warped convexly, and the surface of the second cured resin layer 9 (the surface S2 of the solar cell 200) is warped concavely. The difference in the cure degree $(C_2-C_1)$ and the degree of warpage of the second surface 40b of the first cured resin layer 40 can be controlled by the thickness of the precursor layer 40c, the thermal conductivity and specific heat of the heat sink 16, the amount of ultraviolet light L applied, and the temperature of the surface of the precursor layer 40c during irradiation with ultraviolet light L.

The integrated light quantity of ultraviolet light L applied to the outer surface (40b) of the precursor layer 40c may be, for example, 300 to 1200 mJ/cm². The smaller the integrated light quantity is, the larger the difference in the cure degree $(C_2-C_1)$ tends to be. The larger the integrated light quantity is, the smaller the difference in the cure degree $(C_2-C_1)$ tends to be.

The heat sink 16 may be formed of a material with a large thermal conductivity and a large specific heat. For example, the heat sink may be formed of at least one metal selected from the group consisting of zinc, aluminum, duralumin, gold, silver, tungsten, copper, and magnesium. Of these metals, aluminum is relatively less expensive and easy to process. The thermal conductivity of the heat sink 16 may be, for example, 150 to 420 W/mK.

Figure 4:
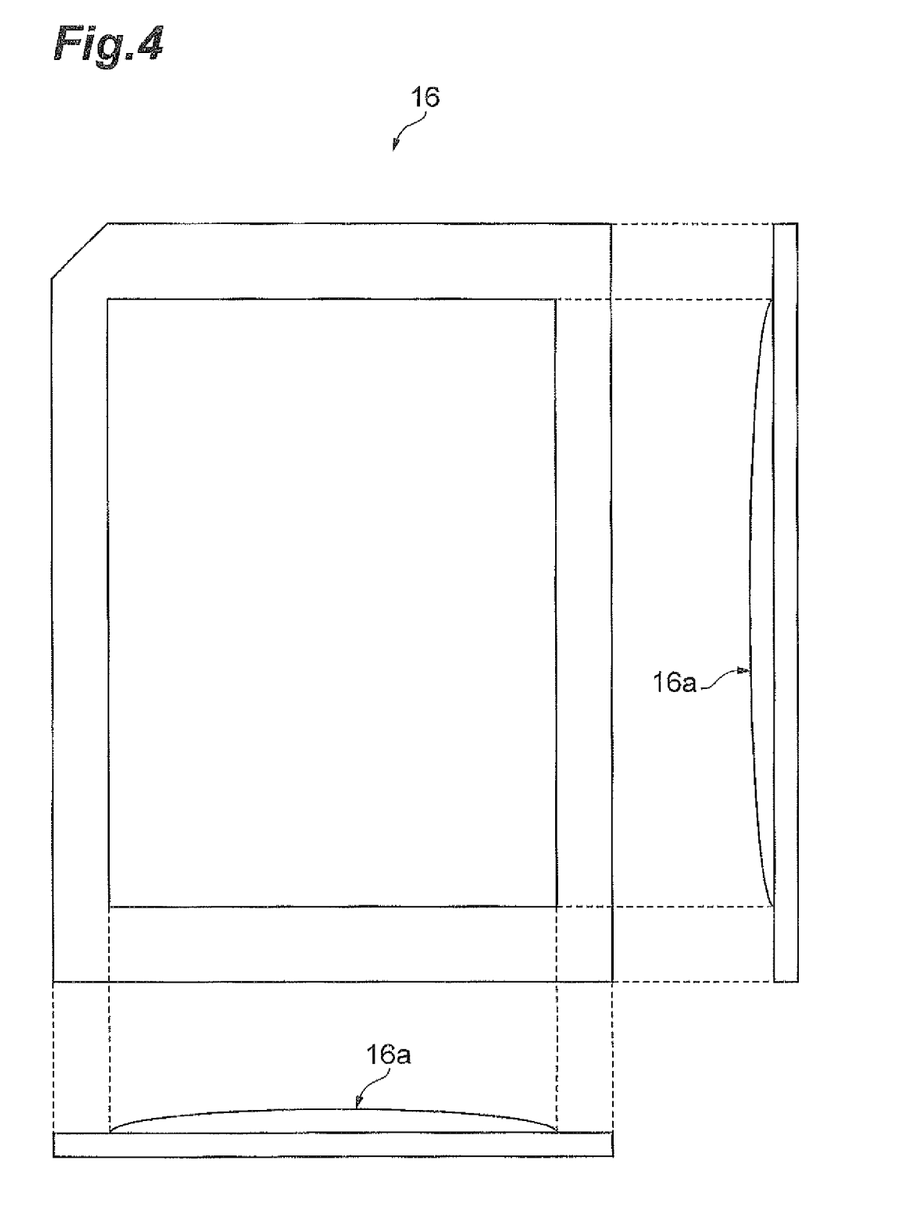
FIG. 4 is a three orthogonal view of a heat sink used for a method for producing a solar cell according to an embodiment of the present invention.

As shown in FIG. 3C and FIG. 4, a surface 16a of the heat sink 16 pressed against the surface of the second cured resin layer 9 (the surface S2) may have an R configuration. That is, the surface 16a of the heat sink 16 may be a curved surface. In this case, since it is easy for the surface 16a of the heat sink 16 to adhere firmly to the surface of the second cured resin layer 9, a gap between both is less likely to occur, and the positions of both are less likely to shift. Consequently, it is likely that heat will propagate from the surface of the second cured resin layer 9 to the surface 16a of the heat sink 16, and heat radiation by the heat sink 16 becomes easier. The surface 16a of the heat sink 16 may be flat.

When the first cured resin layer 40 is formed of an ultraviolet curable resin, it is easier to control the reaction rate (curing rate) and it is easier to control the difference in the cure degree $(C_2-C_1)$ in the first cured resin layer 40 than when a thermosetting resin is used. The ultraviolet curable resin may be, for example, a resin of which the curing reaction is less susceptible to oxygen, such as an epoxy resin. In this case, since the outer surface (40b) of the precursor layer 40c to which ultraviolet light is applied cures earlier than the inside of the precursor layer 40c, the second surface 40b of the first cured resin layer 40 (the surface S1 of the solar cell 200) is likely to be warped convexly. That is, when a resin of which the curing reaction is less susceptible to oxygen is used, it is easy to control the difference in the cure degree in the first cured resin layer 40.

If a resin of which the curing reaction is susceptible to oxygen, such as an acrylic resin, is used, the curing reaction in the outer surface (40b) of the precursor layer 40c will be inhibited by oxygen, and the inside of the precursor layer 40c will cure earlier than the outer surface. Consequently, the second surface 40b of the first cured resin layer 40 (the surface S1 of the solar cell 200) is likely to be warped concavely. However, when the precursor layer 40c is cured in an atmosphere isolated from oxygen, it is possible to form the first cured resin layer 40 out of a resin of which the curing reaction is susceptible to oxygen.

The coating material that is the source material of the first cured resin layer 40 may contain, for example, a cationic photopolymerization initiator as a reaction initiator. The cationic photopolymerization initiator may be, for example, a sulfonium salt, an iodonium salt, a diazonium salt, or a ferrocenium salt. Sulfonium salts are used easily in terms of the control of the reaction rate being easy. The coating material may contain a sensitizer or a thermal polymerization initiator in addition to a cationic photopolymerization initiator.

The precursor layer 40c is formed by, for example, screen printing. The number of meshes of the printing plate (screen mesh) may be, for example, 50 to 400 mesh/inch. The material of the screen mesh is selected in accordance with the composition of the ultraviolet curable resin (uncured resin) contained in the coating material, for example. The screen mesh may be formed of, for example, stainless steel, a polyester, or a nylon.

EXAMPLES

Hereinbelow, the present invention is described in more detail by Examples and Comparative Examples, but the present invention is not limited by these Examples.

Example 1

Formation of the Photoelectric Conversion Layer

The photoelectric conversion layer 100 shown in FIG. 2 was formed on the entire surface of the substrate 10 in a sheet form by the following sequence.

A stainless steel layer was formed on the entire surface of the substrate 10, and an aluminum layer was formed on the entire surface of the stainless steel layer. That is, a stacked body (the lower electrode 20) including the stainless steel layer and the aluminum layer was formed on the substrate 10. The stainless steel layer and the aluminum layer were formed by sputtering. The substrate was one formed of polyethylene naphthalate. The dimensions of the substrate 10 were 320 mm long×200 mm broad×100 μm thick.

An amorphous silicon layer having a PIN junction (the photoelectric conversion unit 30) was formed on the lower electrode 20. The amorphous silicon layer was formed by plasma CVD.

Next, the transparent electrode layer 7 made of ITO was formed on the photoelectric conversion unit 30. The transparent electrode layer 7 was formed by sputtering.

The opening h1 was formed in the lower electrode 20, the photoelectric conversion unit 30 and the transparent electrode layer 7 by laser processing, and these were divided into five cells. A YAG laser was used as the laser. Also the opening h2 was formed by laser processing.

An ink for an insulating resin layer was printed by screen printing, then the ink was heated to 160° C. in an oven, and the ink was dried to form the insulating resin layer 6 that divides unit cells from each other.

An electrically conductive ink in which carbon black was dispersed was printed by screen printing, then the ink was heated to 160° C. in an oven, and the ink was dried to form the interconnection layer 8.

Through the above processes, the photoelectric conversion layer 100 was completed.

[Formation of the Second Cured Resin Layer]

100 parts by mass of γ-butyrolactone and 50 parts by mass of butyl cellosolve acetate were mixed to prepare a solvent. 100 parts by mass of a saturated polyester resin (a thermosetting resin) was added to 150 parts by mass of the solvent while the solvent was stirred. Vylon 200 manufactured by Toyobo Co., Ltd. was used as the saturated polyester resin. After the saturated polyester resin was completely dissolved in the solvent, 2.5 parts by mass of an antifoaming agent and 50 parts by mass of cross-linked acrylic beads were added to the solvent while the solvent was stirred. J-4PY manufactured by Negami Chemical Industrial Co., Ltd. was used as the cross-linked acrylic beads. The average particle size of the cross-linked acrylic bead was 2.2 μm.

After the antifoaming agent and the cross-linked acrylic beads were added to the solvent, 40 parts by mass of a n-butylated melamine resin that is a curing agent was added to the solvent, and the solvent was mixed. U-Van 21R manufactured by Mitsui Chemicals, Inc. was used as the n-butylated melamine resin. Through the above processes, the coating material for the second cured resin layer was prepared.

The coating material for the second cured resin layer was applied to the entire surface of the photoelectric conversion layer 100 by screen printing, and then the coating material was heated to 150° C. in an oven and dried to advance the thermosetting reaction in the coating material; thus, the second cured resin layer 9 was formed. The thickness of the second cured resin layer 9 was adjusted to 10 μm.

[Formation of the First Cured Resin Layer]

A mixture of resins containing the following components was prepared.

50 parts by mass of 3',4'-epoxycyclohexylmethyl (an ultraviolet curable resin) (Celloxide CEL2021P manufactured by Daicel Corporation).

50 parts by mass of oxetane (an ultraviolet curable resin) (OXT-221 manufactured by Toagosei Co., Ltd.).

2 parts by mass of a photopolymerization initiator (IRGACURE 290 manufactured by BASF SE).

While the mixture of resins mentioned above was stirred, 10 parts by mass of hydrophobic fumed silica was added to the mixture to prepare the coating material for the first cured resin layer. Aerosil R972 manufactured by Nippon Aerosil Co., Ltd. was used as the hydrophobic fumed silica.

The coating material for the first cured resin layer was applied to a surface of the substrate 10 located on the opposite side to the photoelectric conversion layer 100 by screen printing to form the precursor layer 40c. The thickness of the precursor layer 40c was adjusted to 30 μm. Ultraviolet light L was applied to the outer surface (40b) of the precursor layer 40c in a state where the surface of the second cured resin layer 9 (the surface S2) is mounted on the heat sink 16 made of aluminum. The integrated light quantity of ultraviolet light (UV integrated light quantity) was adjusted to the value shown in Table 1. A thermolabel was attached to the outer surface of the precursor layer 40c to measure the temperature (surface temperature) of the outer surface of the precursor layer 40c during irradiation with ultraviolet light L. The surface temperature was the value shown in Table 1. The curing (photopolymerization reaction) of the ultraviolet curable resin in the precursor layer 40c was advanced by the irradiation with ultraviolet light; thus, the first cured resin layer 40 was formed.

By performing the above processes, the solar cell 200 in a sheet form of Example 1 was fabricated. The solar cell 200 was one comprising the first cured resin layer 40, the substrate 10 stacked on the first cured resin layer 40, the photoelectric conversion layer 100 stacked on the substrate 10, and the second cured resin layer 9 stacked on the photoelectric conversion layer 100. The average linear expansion coefficient of the cured resin constituting the first cured resin layer 40 was 100 ppm/° C. The average linear expansion coefficient of the cured resin constituting the second cured resin layer 9 was 60 ppm/° C. The linear expansion coefficient of the polyethylene naphthalate constituting the substrate 10 was 20 ppm/° C. The solar cell 200 was one including 5 unit cells u connected in series. The effective area of each unit cell (the area of the light receiving surface) was 40 mm$^2$.

Examples 2 and 3 and Comparative Example 5

In Examples 2 and 3 and Comparative Example 5, the UV integrated light quantity was adjusted to the values shown in Table 1. In Examples 2 and 3 and Comparative Example 5, the surface temperature of the precursor layer during irradiation with ultraviolet light was the values shown in Table 1. The solar cell of each of Examples 2 and 3 and Comparative Example 5 was fabricated in the same manner as in Example 1, except for the above items. Also the solar cell of each of Examples 2 and 3 and Comparative Example 5 was, like Example 1, one comprising the first cured resin layer, the substrate stacked on the first cured resin layer, the photoelectric conversion layer stacked on the substrate, and the second cured resin layer stacked on the photoelectric conversion layer.

Comparative Examples 1 to 4

In Comparative Examples 1 to 4, the first cured resin layer was formed without using a heat sink. In Comparative Examples 1 to 4, the UV integrated light quantity was adjusted to the values shown in Table 1. In Comparative Examples 1 to 4, the surface temperature of the precursor layer during irradiation with ultraviolet light was the values shown in Table 1. The solar cell of each of Comparative Examples 1 to 4 was fabricated in the same manner as in Example 1, except for the above items. Also the solar cell of each of Comparative Examples 1 to 4 was, like Example 1, one comprising the first cured resin layer, the substrate stacked on the first cured resin layer, the photoelectric conversion layer stacked on the substrate, and the second cured resin layer stacked on the photoelectric conversion layer.

<Estimation of the Cure Degree>

By the following method, the cure degree ($C_1$) of the first surface 40a side of the first cured resin layer 40 facing the substrate 10, the cure degree ($C_2$) of the second surface 40b side of the first cured resin layer 40 on the opposite side to the first surface 40a, and the difference in the cure degree ($C_2-C_1$) of Example 1 were obtained.

The first cured resin layer 40 was peeled off from the solar cell 200 of Example 1. The infrared spectroscopy spectrum of the first surface 40a side of the first cured resin layer 40 of Example 1 was measured. The infrared spectroscopy spectrum of the second surface 40b side of the first cured resin layer 40 of Example 1 was measured. As Reference Example 1, the precursor layer 40c was formed in the same manner as in Example 1. The precursor layer 40c of Reference Example 1 was not irradiated with ultraviolet light, and the infrared spectroscopy spectrum of the precursor layer 40c of Reference Example 1 was measured. Each infrared spectroscopy spectrum mentioned above was measured on the basis of the attenuated total reflection method (ATR method) using a diamond crystal. An infrared spectrometer "FT-IR NEXUS 670" manufactured by Thermo Nicolet was used for the measurement of each infrared spectroscopy spectrum mentioned above.

The values of w and $w_S$ were selected on the basis of the comparison of the infrared spectroscopy spectrum of Reference Example 1. 980 $cm^{-1}$ was selected as the wave number w, and 1730 $cm^{-1}$ was selected as the wave number $w_S$. The intensity of the spectrum at 980 $cm^{-1}$ (the wave number w) is derived from the epoxy group of 3',4'-epoxycyclohexylmethyl that is the source material (monomer) of the first cured resin layer 40. The intensity of the spectrum at 1730 $cm^{-1}$ (the wave number $w_S$) is derived from the ester structure of 3',4'-epoxycyclohexylmethyl. Subsequently, the intensity $i_0$ at 980 $cm^{-1}$ (the wave number w) in the infrared spectroscopy spectrum of Reference Example 1 was obtained. The $i_0$ of Reference Example 1 was 0.129. Also $i_{S0}$ at 1730 $cm^{-1}$ (the wave number $w_S$) in the infrared spectroscopy spectrum of Reference Example 1 was obtained. The $i_{S0}$ of Reference Example 1 was 0.129.

The intensity $i_S$ at 1730 $cm^{-1}$ (the wave number $w_S$) in the infrared spectroscopy spectrum of the first surface 40a side of the first cured resin layer 40 of Example 1 was obtained. From this $i_S$ and the $i_{S0}$ of Reference Example 1, the $i_S/i_{S0}$ of the first surface 40a side of Example 1 was calculated. The $i_S/i_{S0}$ of the first surface 40a side of Example 1 is shown in Table 1. The intensity i at 980 $cm^{-1}$ (the wave number w) in the infrared spectroscopy spectrum of the first surface 40a side of the first cured resin layer 40 of Example 1 was obtained. The intensity i of the first surface 40a side of Example 1 was multiplied by the $i_S/i_{S0}$ of the first surface 40a side of Example 1 to calculate the ($i \times i_S/i_{S0}$) of the first surface 40a side of Example 1. The calculation result is shown in Table 1. Based on Equation 1, the cure degree $C_1$ of the first surface 40a side of Example 1 was calculated from the $i_0$ of Reference Example 1 and the ($i \times i_S/i_{S0}$) of the first surface 40a side of Example 1. The cure degree $C_1$ of Example 1 is shown in Table 1.

The intensity $i_S$ at 1730 $cm^{-1}$ (the wave number $w_S$) in the infrared spectroscopy spectrum of the second surface 40b side of the first cured resin layer 40 of Example 1 was obtained. From this $i_S$ and the $i_{S0}$ of Reference Example 1, the $i_S/i_{S0}$ of the second surface 40b side of Example 1 was calculated. The $i_S/i_{S0}$ of the second surface 40b side of Example 1 is shown in Table 1. The intensity i at 980 $cm^{-1}$ (the wave number w) in the infrared spectroscopy spectrum of the second surface 40b side of the first cured resin layer 40 of Example 1 was obtained. The intensity i of the second surface 40b side of Example 1 was multiplied by the $i_S/i_{S0}$ of the second surface 40b side of Example 1 to calculate the ($i \times i_S/i_{S0}$) of the second surface 40b side of Example 1. The calculation result is shown in Table 1. Based on Equation 1, the cure degree $C_2$ of the second surface 40b side of Example 1 was calculated from the $i_0$ of Reference Example 1 and the ($i \times i_S/i_{S0}$) of the second surface 40b side of Example 1. The cure degree $C_2$ of Example 1 is shown in Table 1.

The difference between the cure degree $C_2$ of Example 1 and the cure degree $C_1$ of Example 1 was obtained. The difference in the cure degree ($C_2-C_1$) of Example 1 is shown in Table 1.

The infrared spectroscopy spectrum of the first surface side of the first cured resin layer of each of the other Examples and Comparative Examples was measured in the same manner as in Example 1. The $i_S/i_{S0}$ and ($i \times i_S/i_{S0}$) of the first surface side of the first cured resin layer of the other Examples and Comparative Examples were calculated in the same manner as in Example 1. The calculation results of these are shown in Table 1, The infrared spectroscopy spectrum of the second surface side of the first cured resin layer of each of the other Examples and Comparative Examples was measured in the same manner as in Example 1. The $i_S/i_{S0}$ and ($i \times i_S/i_{S0}$) of the second surface side of the first cured resin layer of the other Examples and Comparative Examples were calculated in the same manner as in Example 1. The calculation results of these are shown in Table 1. The cure degrees $C_1$ and $C_2$ and the difference in the cure degree ($C_2-C_1$) of each of the other Examples and Comparative Examples were obtained in the same manner as in Example 1. The cure degrees $C_1$ and $C_2$ and the difference in the cure degree ($C_2-C_1$) of each Example and each Comparative Example are shown in Table 1.

As shown in Table 1, $C_2$ was larger than $C_1$ in all the Examples and Comparative Examples. ($C_2-C_1$) was in the range of 2 to 15% in all the Examples. On the other hand, ($C_2-C_1$) was out of the range of 2 to 15% in all the Comparative Examples.

<Evaluation of the External Appearance of the First Cured Resin Layer>

The external appearance of the first cured resin layer of each Example and each Comparative Example was evaluated by visual inspection. The evaluation results are shown in Table 1. There was no defect in the external appearance of the first cured resin layer of each of all the Examples and Comparative Examples 2 and 3. The first cured resin layer of Comparative Example 1 was distorted. There were creases in the first cured resin layer of each of Comparative Examples 4 and 5.

<Evaluation of the Shape of the Solar Cell>

The solar cell of Example 1 was placed in a thermomechanical analyzer in a state where the second cured resin layer (the light receiving surface of the solar cell) was directed upward. The relative humidity (RH) in the thermomechanical analyzer was adjusted to 50%, the temperature in the thermomechanical analyzer was adjusted to 25° C., and the solar cell was allowed to stand for 1 hour in the thermomechanical analyzer. The shape of the solar cell immediately after standing was observed visually.

The solar cell of Example 1 was placed in a thermomechanical analyzer in a state where the second cured resin layer was directed upward. The relative humidity (RH) in the thermomechanical analyzer was adjusted to 50%, the temperature in the thermomechanical analyzer was adjusted to 80° C., and the solar cell was allowed to stand for 30 minutes in the thermomechanical analyzer. The shape of the solar cell immediately after standing was observed visually.

TMA/SS6100 manufactured by SII NanoTechnology Inc. was used as the thermomechanical analyzer mentioned above.

The shape of the solar cell of each of the other Examples and all the Comparative Examples was evaluated in the same manner as in Example 1. The shape of each solar cell immediately after being allowed to stand at 25° C. for 1 hour and the shape of the solar cell immediately after being allowed to stand at 80° C. for 30 minutes are shown in Table 1. The "convex" shape written in Table 1 means that the surface on the first cured resin layer side of the solar cell is warped concavely, and the surface on the second cured resin layer side of the solar cell (light receiving surface) is warped convexly. The "concave" shape in Table 1 means that the surface on the first cured resin layer side of the solar cell is warped convexly, and the surface on the second cured resin layer side of the solar cell is warped concavely.

As shown in Table 1, the solar cells of all the Examples were in a concave shape at both temperatures of 25° C. and 80° C. That is, in all the Examples, the concave shape of the solar cell was maintained even when the temperature of the solar cell was increased.

In Comparative Example 5, although the first cured resin layer was formed using a heat sink as in the Examples, the solar cell in a concave shape was deformed to a convex shape with an increase in temperature. The deformation of the solar cell of Comparative Example 5 is due to the fact that the UV integrated light quantity was small and ($C_2$–$C_1$) was too large (the cure degree $C_1$ of the first surface side of the first cured resin layer was too small).

In Comparative Examples 1 to 3, the solar cell was in a convex shape at 25° C. The convex shape of the solar cell at 25° C. is due to the fact that the difference in the cure degree ($C_2$–$C_1$) was small because the first cured resin layer was formed without using a heat sink.

In Comparative Example 1, the solar cell was in a convex shape also at 80° C. because the UV integrated light quantity during the formation of the first cured resin was large and the surface temperature of the precursor layer was high.

In Comparative Example 4, the solar cell in a concave shape was deformed to a convex shape with an increase in temperature. The deformation of the solar cell of Comparative Example 4 is due to the fact that the UV integrated light quantity was small and the difference in the cure degree ($C_2$–$C_1$) was too large (the cure degree $C_1$ of the first surface side of the first cured resin layer was too small).

TABLE 1

| | UV integrated light quantity | Heat sink | Surface temperature | First cured resin layer | | | | |
|---|---|---|---|---|---|---|---|---|
| | | | | Measured surface | $i_S$ | $i$ | $i_S/i_{S0}$ | $i \times i_S/i_{S0}$ |
| Reference Example 1 | 0 mJ/cm² | — | — | — | ($i_{S0}$ = 0.129) | ($i_0$ = 0.129) | 1.000 | 0.129 |
| Comparative Example 1 | 1200 mJ/cm² | Absent | 110° C. | Second surface | 0.030 | 0.011 | 0.233 | 0.003 |
| | | | | First surface | 0.028 | 0.020 | 0.217 | 0.004 |
| Comparative Example 2 | 600 mJ/cm² | Absent | 90° C. | Second surface | 0.021 | 0.006 | 0.161 | 0.001 |
| | | | | First surface | 0.020 | 0.016 | 0.153 | 0.002 |
| Comparative Example 3 | 300 mJ/cm² | Absent | 75° C. | Second surface | 0.012 | 0.045 | 0.092 | 0.004 |
| | | | | First surface | 0.058 | 0.013 | 0.450 | 0.006 |
| Comparative Example 4 | 150 mJ/cm² | Absent | Less than 50° C. | Second surface | 0.052 | 0.035 | 0.402 | 0.014 |
| | | | | First surface | 0.058 | 0.077 | 0.450 | 0.035 |
| Example 1 | 1200 mJ/cm² | Present | 75° C. | Second surface | 0.026 | 0.009 | 0.202 | 0.002 |
| | | | | First surface | 0.032 | 0.021 | 0.248 | 0.005 |
| Example 2 | 600 mJ/cm² | Present | 50° C. | Second surface | 0.028 | 0.010 | 0.217 | 0.002 |
| | | | | First surface | 0.042 | 0.033 | 0.326 | 0.011 |
| Example 3 | 300 mJ/cm² | Present | Less than 50° C. | Second surface | 0.012 | 0.049 | 0.092 | 0.005 |
| | | | | First surface | 0.091 | 0.031 | 0.705 | 0.022 |
| Comparative Example 5 | 150 mJ/cm² | Present | Less than 50° C. | Second surface | 0.032 | 0.038 | 0.247 | 0.009 |
| | | | | First surface | 0.078 | 0.064 | 0.605 | 0.039 |

| | First cured resin layer | | | Shape of solar cell | |
|---|---|---|---|---|---|
| | Cure Degree | $C_2$-$C_1$ | External appearance | 25° C. | 80° C. |
| Reference Example 1 | — | 0.0% | — | — | — |
| Comparative Example 1 | $C_2$ 98.0% $C_1$ 96.6% | 1.4% | Distortion | Convex | Convex |
| Comparative Example 2 | $C_2$ 99.3% $C_1$ 98.1% | 1.2% | Good | Convex | Concave |
| Comparative Example 3 | $C_2$ 96.8% $C_1$ 95.5% | 1.3% | Good | Convex | Concave |
| Comparative Example 4 | $C_2$ 89.1% $C_1$ 73.2% | 15.9% | Creases | Concave | Convex |
| Example 1 | $C_2$ 98.6% $C_1$ 96.0% | 2.6% | Good | Concave | Concave |

TABLE 1-continued

| | | | | | | |
|---|---|---|---|---|---|---|
| Example 2 | $C_2$ | 98.3% | 6.6% | Good | Concave | Concave |
| | $C_1$ | 91.7% | | | | |
| Example 3 | $C_2$ | 96.5% | 13.5% | Good | Concave | Concave |
| | $C_1$ | 83.0% | | | | |
| Comparative | $C_2$ | 92.7% | 22.7% | Creases | Concave | Convex |
| Example 5 | $C_1$ | 70.0% | | | | |

INDUSTRIAL APPLICABILITY

The solar cell according to the present invention is installed in, for example, electronic devices such as wristwatches or portable calculators.

REFERENCE SIGNS LIST

9 . . . second cured resin layer, 10 . . . substrate, 16 . . . heat sink, 40 . . . first cured resin layer, 40a . . . first surface of first cured resin layer, 40b . . . second surface of first cured resin layer, 100 . . . photoelectric conversion layer, 200 . . . solar cell, S1 . . . surface on first cured resin layer side of solar cell, S2 . . . surface on second cured resin layer side of solar cell, T1 . . . thickness of first cured resin layer, T2 . . . thickness of second cured resin layer.

What is claimed is:

1. A solar cell in a sheet form, comprising:
a first cured resin layer;
a substrate stacked on the first cured resin layer and containing a resin;
a photoelectric conversion layer stacked on the substrate; and
a second cured resin layer stacked on the photoelectric conversion layer, wherein
a linear expansion coefficient of a cured resin contained in the first cured resin layer is not less than a linear expansion coefficient of a cured resin contained in the second cured resin layer,
the linear expansion coefficient of the cured resin contained in the second cured resin layer is larger than a linear expansion coefficient of the resin contained in the substrate,
$C_2$ is larger than $C_1$ and ($C_2-C_1$) is 2 to 15% when a cure degree of a first surface side of the first cured resin layer facing the substrate is denoted by $C_1$ % and a cure degree of a second surface side of the first cured resin layer on an opposite side to the first surface is denoted by $C_2$ %,
a surface on the first cured resin layer side of the solar cell is warped convexly, and
a surface on the second cured resin layer side of the solar cell is warped concavely.

2. The solar cell according to claim 1, wherein
a thickness of the first cured resin layer is 5 to 50 μm and a thickness of the second cured resin layer is 3 to 30 μm.

3. The solar cell according to claim 1, wherein
the first cured resin layer is formed of an ultraviolet curable epoxy resin.

4. The solar cell according to claim 1, wherein
an internal stress of the first cured resin layer is larger than an internal stress of the second cured resin layer.

5. The solar cell according to claim 1, wherein
the first cured resin layer is thicker than the second cured resin layer.

6. A method for producing the solar cell according to claim 1, comprising:
a step of forming the photoelectric conversion layer on the substrate;
a step of forming the second cured resin layer on the photoelectric conversion layer; and
a step of forming the first cured resin layer by attaching an ultraviolet curable resin to a surface of the substrate located on an opposite side to the photoelectric conversion layer and irradiating the ultraviolet curable resin with ultraviolet light in a state where a heat sink is kept in contact with the second cured resin layer.

* * * * *